United States Patent [19]

Hashimoto et al.

[11] Patent Number: 4,811,265

[45] Date of Patent: Mar. 7, 1989

[54] BASIC CELL TYPE FULL SEARCH VECTOR QUANTIZATION CODER

[75] Inventors: Hideo Hashimoto; Hideo Kuroda, both of Kanagawa; Hiroaki Kikuchi, Tokyo; Tokumichi Murakami, Kanagawa, all of Japan

[73] Assignees: Nippon Telegraph & Telephone Corporation; Mitsubishi Denki Kabushiki Kaisha, both of Tokyo, Japan

[21] Appl. No.: 825,330

[22] Filed: Feb. 3, 1986

[51] Int. Cl.$^4$ .............................................. G06G 7/00
[52] U.S. Cl. .................................... 364/730; 341/106
[58] Field of Search ............ 364/730, 347 AD, 347 M

[56] References Cited

U.S. PATENT DOCUMENTS 4,107,669 8/1978 Tewksbury ................. 340/347 DD
4,280,191 7/1981 Rockett, Jr. ............. 340/347 AD X
4,560,977 12/1985 Murakami et al. .......... 340/347 DD

OTHER PUBLICATIONS

Murakami et al., "Interframe Coding Using Adaptive Vector Quantizer", Institute of Electronics and Communication Engineering of Japan Technical Report, vol. 84, No. 1, pp. 1–8 (Apr. 3, 1984).

Primary Examiner—Gary V. Harkcom
Assistant Examiner—Tan V. Mai
Attorney, Agent, or Firm—Wolf, Greenfield & Sacks

[57] ABSTRACT

A basic cell type full search vector quantization coder has a plurality of basic cells and a minimum distortion output vector detector. In each basic cell a common K-dimensional input vector is divided by b into b sub-blocks and n output vectors are read one by one out of a set of N output vectors. The output vectors are also divided by b. Comparison is made K/b times between the components of the input and the output vectors to detect one of n output vectors positioned at the shortest distance from the input vector. The detctor compares the outputs supplied by the basic cells and detects one of the output vectors producing the minimum distortion, whose index signal being an output of the coder.

5 Claims, 4 Drawing Sheets

BASIC CELL TYPE FULL SEARCH VECTOR QUANTIZATION CODER

FIELD OF THE INVENTION

The present invention relates to a technical field of vector quantization adapted to group a plurality of signals included in a sequence of input signals from, for example, an image transmition device into blocks and quantize such signal blocks in a multidimensional signal space.

BACKGROUND OF THE INVENTION

Firstly, a principle of vector quantization will be briefly explained. It is assumed here that signals included in a sequence of input signals from a source of informations is grounded K by K (K being a plural number) to provide input vectors $x = \{x_1, x_2, \ldots, x_K\}$. It is also assumed here that an output vector $y_i = \{y_{i,1}, y_{i,2}, \ldots, y_{i,K}\}$ corresponds to a representative point (for example, a center of gravity) of a partial space $R_i$ which is one of N divisions $R_1, R_2, \ldots, R_N$ of K-dimensional Euclidean Signal Space $R^K$ ($x \in R^K$), and that a set of output vectors is represented as $Y = \{y_1, y_2, \ldots, y_N\}$. Then vector quantization Q is defined by the following equations:

$$Q: R^K \to Y$$

wherein, $$R_i = Q^{-1}(y_i) = \{x \in R^K : Q(x) = y_i\}$$

$$\bigcup_{i=1}^{N} R_i = R^K, R_i \cap R_j = \phi (i \neq j).$$

The above-mentioned vector quantization Q is represented as a cascade connection of coding C and decoding D. Coding C is a mapping of the set $Y = \{y_1, y_2, \ldots, y_N\}$ of the output vectors in $R^K$ into an index set (coded output) $I = \{1, 2, \ldots, N\}$, while decoding D is a mapping from I to Y. In other words, $$C: R^K \to I, D: I \to Y$$

$$Q = D \cdot C$$

Thus, in vector quantization, said index set I is transmitted or recorded, so the coding efficiency is greatly enhanced. Vector quantization is defined as a mapping of the input vector x into the output vector $y_i$ which is positioned at the shortest distance from the input vector (thus providing a minimum distortion). To be concrete, if a distance between the input vector x and the output vector $y_i$ (i.e., a distortion) is assumed to be represented as $d(x, y_i)$, the following relation is obtained:

if $d(x, y_i) < d(x, y_j)$ for all $j \in R_i$, namely $x \to y_i$.

The set Y of the output vectors $y_i$ as shown in FIG. 1 can be obtained by clustering algorithm by use of a sequence of input signals from the source of informations which serves as a training model (the clustering algorithm means a series of operations or repeating selection of representative points and division of the signal space until the sum of the distortions reaches to a minimum value).

FIG. 2 is a block diagram showing a construction of a vector quantization coder of the prior art. In FIG. 2, the numeral 1 designates an input vector register (I.V.R.), numeral 2 a code table address counter (C.T.A.C.), numeral 3 an output vector code table memory (O.V.C.T.M.), numeral 4 a code table output vector register (C.T.O.V.R.), numeral 5 a parallel subtractor (P.S.), numeral 6 a parallel absolute value arithmetic unit (P.A.V.A.U.), numeral 7 an absolute value distortion detector (A.V.D.D.), numeral 8 a minimum distortion output vector detector (M.D.O.V.D.) and numeral 9 an index latch (I.L.) The output vector code table memory 3 prestores a set of the output vectors converged so as to make the sum of the distortions minimum by clustering algorithm.

In operation of the vector quantization coder of the prior art shown in FIG. 2, signals included in a sequence of input signals are grouped K by K into signal blocks and each block is taken in by the input vector register 1 as the input vector $x = \{x_1, x_2, \ldots, x_K\}$. As the code table address counter 2 counts up in sequence from $i = 1$ to $i = N$, the output vectors $y_i = \{y_{i,1}, y_{i,2}, \ldots, y_{i,K}\}$ are read out of the output vector code table memory 3 in sequence and latched into the code table output vector register 4. For each output vector $y_i$, the absolute value distortion $d_i$ between the input and the output vectors is calculated by means of the following equation by the parallel subtractor 5, the parallel absolute value arithmetic unit 6 and the absolute value distortion detector 7:

$$d_i = d(x, y_i) = \sum_{j}^{K} |x_j - y_{i,j}|.$$

Then the minimum distortion output vector detector 8 detects the output vector which makes said absolute value distortion $d_i$ minimum. The minimum distortion d is given as follows:

$$d = \min_i d(x, y_i) = \min_i \left[ \sum_j |x_j - y_{i,j}| \right].$$

The minimum distortion output vector detector 8 calculates the distortion $d(x, y_i)$ between the input vector x and each of output vectors $y_i$ read in sequence out of the output vector code table memory 3, and compares said distortion with the minimum distortion previously obtained. When a smaller value is detected, the detector 8 holds it as a new minimum distortion, and, whenever such a smaller value is obtained, transmits a strobe signal to the index latch 9 which, in turn, receives the index signal; which is the code table address of the output vector $y_i$. The above-mentioned procedure is repeated until all the output vectors $y_i$ ($i = 1 \sim N$) are read out of the output vector code table memory 3, whereby a full search operation may be completed. Upon completion of such an operation, the index signal i of the output vector $y_i$ which produces the minimum distortion d remains in the index latch 9 and this value is a coded output. In a decoder the output vector which corresponds to the index signal i sent from the coder is read out of the output vector code table memory, whereby video signals are reproduced.

Since the vector quantization coder of the prior art is constructed as described above, the coder has serious drawbacks. The dimensional number K (i.e., a block size), once established, is unchanging. As a result, it is impossible to use the vector quantization coder of the same construction for other block sizes suitable for characteristics of a sequence of input signals. Moreover, the construction of the device is complicated.

SUMMARY OF THE INVENTION

An object of the present invention is to overcome the drawbacks of the prior art as explained above.

A further objects of the present invention is to provide a basic cell type full search vector quantization coder in which input and output vectors are easily processed in respect of arbitrary block sizes.

A still further object of the present invention is to provide a basic cell type full search vector quantization coder which can be realized in a simple module construction.

Such objects can be achieved in the present invention by utilizing basic cells in which K components of an input vector are divided by an arbitrary sub-block size b into K/b sub-groups, and in which n output vectors are taken one by one out of a set of N output vectors that are respectively representative points of N partial spaces obtained by dividing a K-dimensional signal space $R^K$ including the input vector. The components of the output vector read out are taken in by a register in sequence b by b. The components of the input and the output vectors are compared each other b by b. The comparison is performed K/b times to search one of the output vectors which is positioned at the shortest distance from the input vector. Such an operation is performed in each of the basic cells constructed in modules. The output vectors detected in each basic cell as those positioned at the shortest distance from the input vector are compared each other to find the output vector that produces the shortest distance among those output vectors.

Such basic cells can be arranged in parallel or in series in a plurality of necessary stages. Output signals from the parallelly arranged basic cells are compared each other to perform vector quantization coding. On the other hand, each output of the basic cells arranged in series is applied to the next stage as an initial distortion and its index, and a coded output is obtained from the last stage.

Briefly, the basic cell type full search vector quantization coder of the present invention utilizes basic cells in which the input vector x and the output vectors $y_i$ of the block size K are divided by an arbitrary sub-block size b into K/b sub-groups for further processing, and which perform this procedure for n output vectors $y_i$. Accordingly, the vectors can be easily processed in respect of arbitrary block sizes and the vector quantization coder can be realized with a simple module construction, and further, a basic cell type full search vector quantization coder can be obtained which is extremely flexible with regard to the dimensional number of the input vector and the number of output vectors.

BRIEF DESCRIPTION OF THE DRAWINGS

Other objects and advantages of the present invention will become apparent by reference to the detailed description taken in connection with the accompanying drawings, in which.

DETAILED DESCRIPTION OF THE PREFERRED EMBODIMENTS

An embodiment of the present invention will now be explained with reference to FIGS. 3-6.

Figure 2:
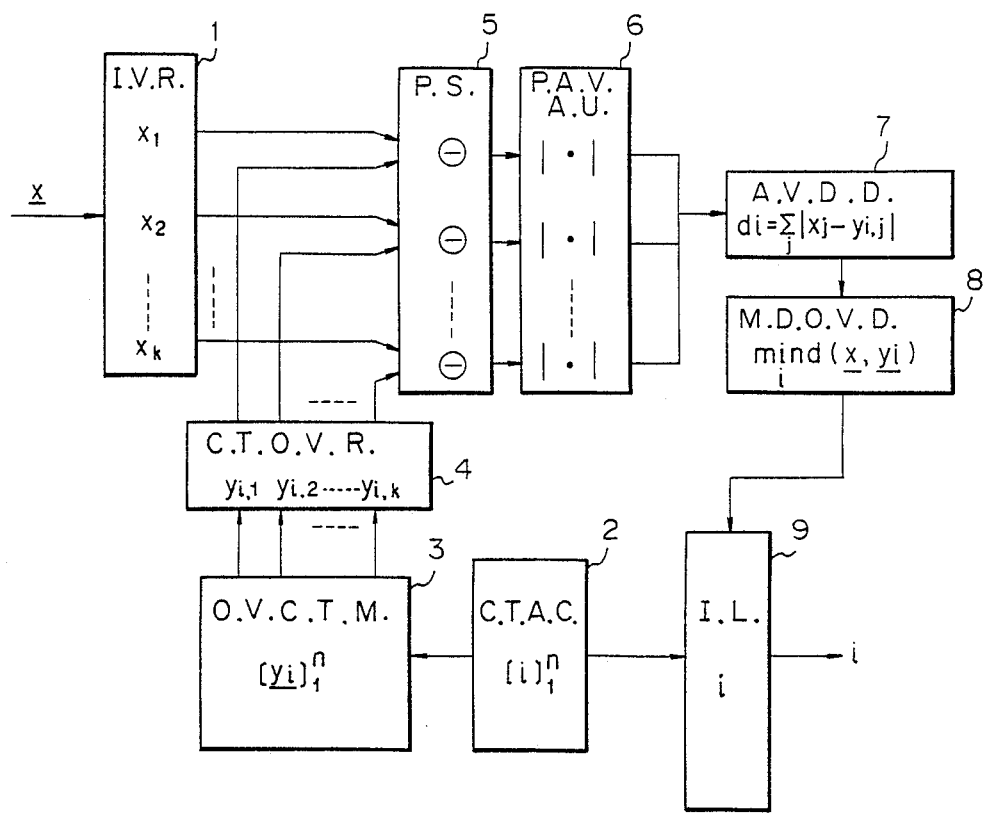
FIG. 2 is a block diagram showing a construction of a vector quantization coder of the prior art.
Figure 3:
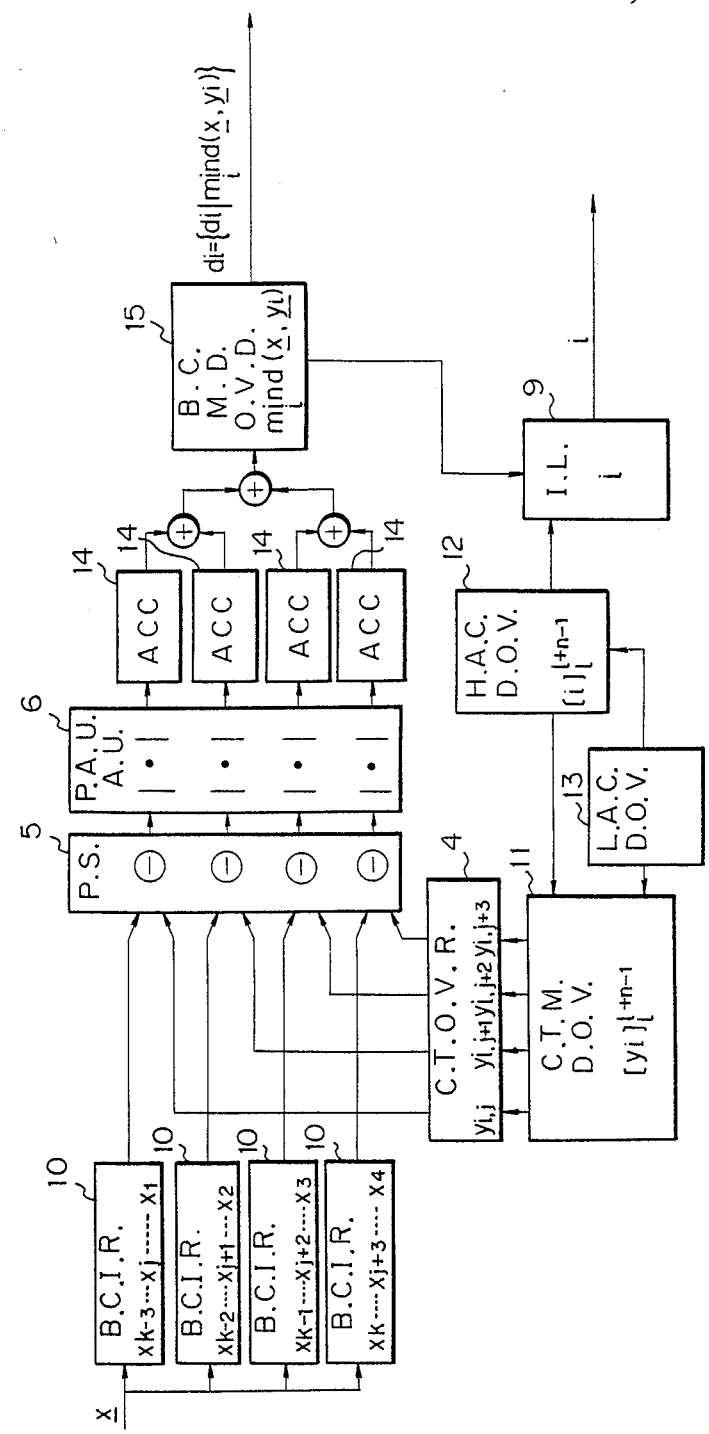
FIG. 3 is a block diagram showing an embodiment of the the constitution of a basic cell in a basic cell type full search vector quantization coder according to the present invention.

FIG. 3 is a block diagram illustrating an embodiment of the construction of a basic cell used in a basic cell type full search vector quantization coder according to the present invention, wherein like parts used in FIG. 2 are designated by the same reference numerals and the detailed descriptions of these parts are therefore omitted here. In FIG. 3, numeral 10 designates each of b basic cell input registers (B.C.I.R.), (b corresponds to a sub-block size referred to later), numeral 11 a code table memory for the divided output vectors (C.T.M.D.O.V.), numeral 12 a high order address counter for the divided output vectors (H.A.C.D.O.V.), numeral 13 a low order address counter for divided output vectors (L.A.C.D.O.V.), numeral 14 distortion accumulators (ACC), and numeral 15 a basic cell minimum distortion output vector detector (B.C.M.D.O.V.D.).

The operation of this embodiment of the present invention will hereafter be explained. Firstly, the operation of the basic cell as shown in FIG. 3 is expalined. A K-dimensional input vector $x=\{x_1, x_2, \ldots, x_K\}$ is divided by b into b sub-blocks (b being a sub-block size equal to four in this embodiment). To be concrete, the components for the input vector x are taken in by four basic cell input registers 10 in sequence from its first component. It is to be noted that the sub-block sizes b must be divisors (other than unity) of various expectable dimensional numbers. The code table memory for the divided output vectors 11 reads out n output vectors taken out of a set of N output vectors. Each of these n output vectors is also divided by b and taken in by the code table output vector register 4 in a similar manner to the case of the input vector. To be concrete, the low order address counter for the divided output vectors 13 counts from 1 up to K/4 so as to read out all the components of one output vector $y_i(=y_{i,1}, y_{i,2}, \ldots, y_{i,K})$. When counting has reached to K/4, the high order address counter for the divided output vectors 12 is incremented by 1. When the high order address counter 12 has completed counting from i=1 up to $i=l+n-1$, n output vectors have all been read out, when counting stops. In this case, every time one output vector changes to another, the basic cell input registers 10 produce the same input vector in the divided form. The components of the input vector x taken in by four basic cell input registers 10 and the components of the respective output vectors $y_i$ taken in by the code table output vector register 4 are used by the parallel subtractor 5 and the parallel absolute value arithmetic unit 6 in order to calculate a distance $|x_j-y_{i,j}|$ which is accumulated by four distortion accumulators 14. When this operation has been conducted K/4 times, a distortion $d(x, y_i)$ is accumulated in each of four distortion accumulators 14 and the sum of those values is inputted as the absolute value distortion $d_i$ to the basic cell minimum distortion output vector detector 15. The absolute value distortion $d_i$ is represented by the following equation:

$$d_i = d(x, y_i) = \sum_{j}^{K} |x_j - y_{i,j}|.$$

The basic cell minimum distortion output vector detector 15, when provided with the absolute value distortion $d_i$ resulted from the input vector x and the output vectors $y_i$, compares said absolute value distortion with the minimum distortion previously obtained. When a smaller distortion is detected, the detector 15 holds this value as a new minimum distortion and transmits a strobe signal to the index latch 9 whenever such a smaller distortion is detected. Then the index signal i for the output vector $y_i$ is taken in by the index latch 9 and the detector 15 outputs the minimum distortion. This procedure is repeated n times (from i=1 up to $i=l+n-1$). When this procedure is completed, the index signal i for the output vector $y_i$ corresponding to the minimum distortion remains in the index latch 9 while the minimum distortion $\min_i d(x, y_i)$ relative to the output vector $y_i$ is outputted from the basic cell minimum distortion output vector detector 15, thus the index signal and the minimum distortion being the output of the basic cell. As described above, since K components of the input vector x (K: a block size) are divided by b (b: a sub-block size) and processed by the basic cell, the basic cell can be utilized without changing the construction so long as the dimensional number of the input vector is the multiple integral of the sub-block size b regardless of any change in the dimensional number of the input vector. It can be understood here that the following relationship is established between said values K, b and n:

$$tc \cdot K \cdot n/b \leq tp \cdot K$$
$$n \leq b \cdot tp/tc$$

wherein,
tp: time required for processing in the vector quantization coder
tc: a cycle time of the code table memory for the divided output vectors 11.

It can be seen from the above-mentioned relashionship that the processing speed of the basic cell shown in FIG. 3 according to the present invention is independent of the dimensional number K of the input vectors x.

Figure 1:
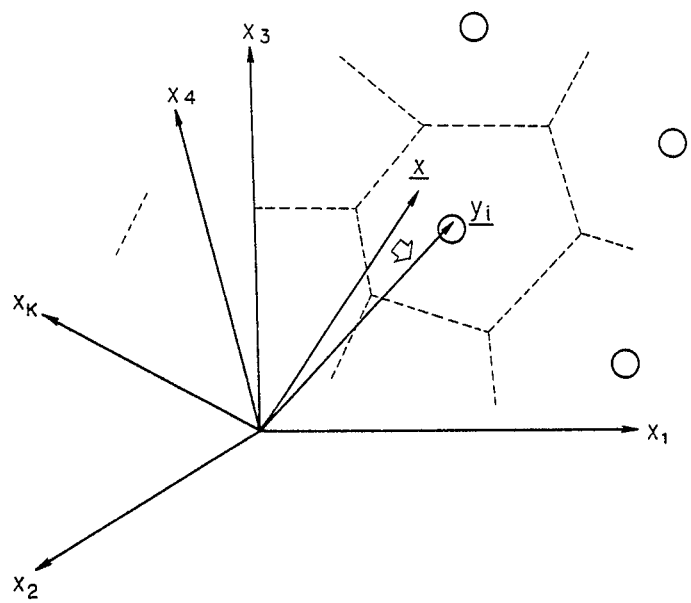
FIG. 1 shows an arrangement of output vectors in vector quantization of the prior art.
Figure 4:
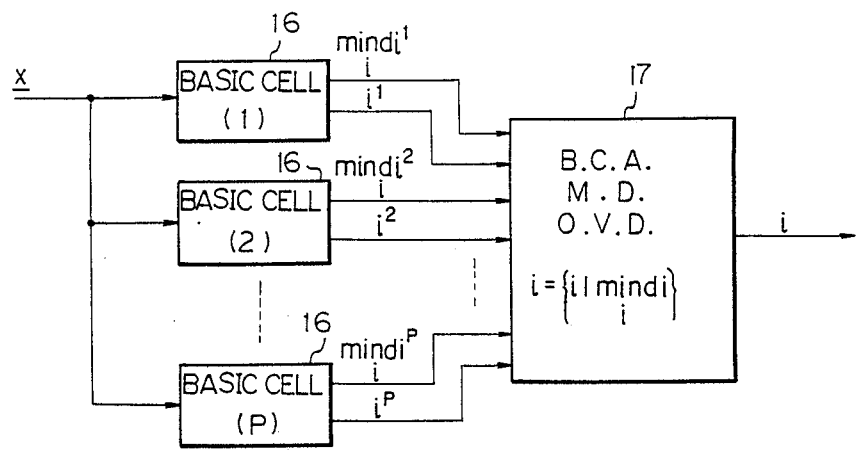
FIG. 4 is a block diagram showing the constitution of a basic cell type full search vector quantization coder using the basic cells shown in FIG. 3.
Figure 5:
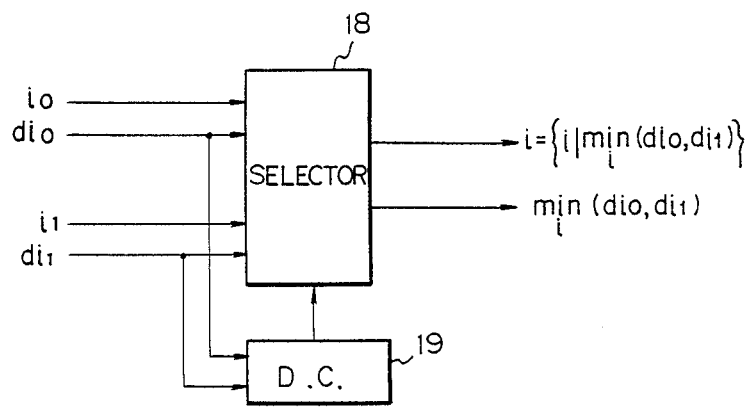
FIG. 5 is a block diagram showing a distortion comparison unit constructing a basic cell array minimum distortion output vector detector shown in FIG. 4.

Reference should be made to FIGS. 4 and 5 in order to explain an embodiment of a basic cell type full search vector quantization coder according to the present invention. FIG. 4 shows a block diagram of the construction of a basic cell type full search vector quantization coder using basic cells shown in FIG. 3. In FIG. 4, each numeral 16 designates the basic cell, while numeral 17 designates a basic cell array minimum distortion output vector detector (B.C.A.M.D.O.V.D.). Further, FIG. 5 is a block diagram showing a distortion comparison unit, a plurality of which construct the basic cell array minimum distortion output vector detector 17 shown in FIG. 4. In FIG. 5, numeral 18 designates a selector while numeral 19 designates a distortion comparator (D.C.).

Returning back to FIG. 4 showing an embodiment of the present invention, P basic cells 16 are arranged in parallel. In the basic cell array minimum distortion output vector detector 17, (P-1) distortion comparison units as shown in FIG. 5 operate to compare the outputs from the respective basic cells 16 in a tournament manner so that the distortion $d_i$ providing a smaller distortion value and the corresponding index signal i remain. As a result, the index signal i supplied from the last-stage comparison unit is transmitted to a decoder as an output of the vector quantization corder of the present invention.

Figure 6:
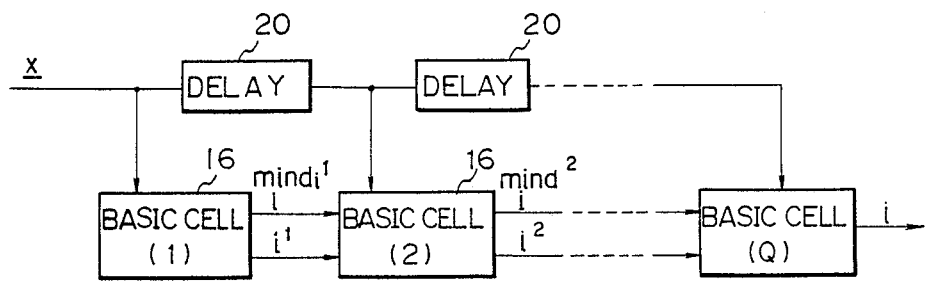
FIG. 6 is a block diagram showing another embodiment of a basic cell type full search vector quantization coder according to the present invention.

Although the basic cells are arranged in parallel in FIG. 4, a similar operation can be anticipated if the basic cells are arranged in series. FIG. 6 illustrates a block diagram of another embodiment of a basic cell type full search vector quantization coder of the present invention. As shown in FIG. 6, one of the basic cells (1) 16 takes in the input vector x and arithmetically operates the same to supply $\min_i |d_i^1$ and $i^1|$ to the next basic cell (2) 16. The basic cell (2) 16 serves to send respectively the value $\min_i d_i^1$ to the basic cell minimum distortion output vector detector 15 and the value $i^1$ to the index latch 9 and executes operation of these values as the initial values to supply the operation results to the basic cell (3) 16. The input vector x is delayed by a delay circuit 20 by the amount of delay in the respective basic cells 16 and then applied to the next-stage basic cell 16. When such a procedure is repeated up to the last-stage basic cell, a coded output is generated at the output of the last-stage basic cell (Q) 16. According to this sort of construction, a pipe-line processing may be feasible.

It should be understood that although certain preferred embodiments of the present invention have been illustrated and described, various modifications, alternatives and equivalents thereof will become apparent to those skilled in the art and, accordingly, the scope of the present invention should be defined only by the appended claims and equivalents thereof.

Various features of the invention are set forth in the following claims.

What is claimed is:

1. A basic cell type full search vector quantization coder for vector-quantizing and coding, by full search, K-dimensional input vectors including K input signals provided by dividing a sequence of input signals into successive signal groups each including K input signals, wherein K is a plural number, said vector quantization coder comprising a plurality of basic cell means and minimum distortion detector means, wherein each of said basic cell means comprises:
a plurality number b of input register means which receive a K-dimensional input vector including K input signals, b being an integer more than 1, and respectively store K/b input signals such that no adjacent two input signals of said K input signals are stored in the same input register means, wherein K/b is an integer, said plurality of input register means being operative to output a stored input signal to form a different set of b input signals in sequence;

first means for taken a plurality number n of output vectors including K components one by one out of a set of N output vectors which correspond to the respective representative points of N subspaces obtained by dividing a K-dimensional signal space including said input vector, and for outputting a different set of b components in any one of said n output vectors in sequence;

second means responsive to outputs of said plurality of input register means and said first means to calculate the distances between said input vector and said n output vectors and detect one of said n output vectors which is positioned at the shortest distance from said input vector, said second means operative to output a distance signal indicating the distance between said input vector and said detected output vector and an index signal associated with said detected output vector;

third means for controlling the sequential reading of said different sets of said b components from said first means, and wherein said minimum distortion detector means is responsive to said distance signals and said index signals output from said plurality of basic cell means to detect the smallest of said distances, and outputs a signal indicating the minimum distortion between said input vector and said N output vectors and an index signal associated with one of said N output vectors which is positioned at the shortest distance from said input vector.

2. Coder as claimed in claim 1, wherein said first means comprises:

a coder table memory storing said N output vectors and operative to sequentially output a different set of b components in any one of n output vectors selected from said N output vectors; and a code table register taking in said different set of b components from said code table memory and supplying said set of be components to said second means.

3. Coder as claimed in claim 2, wherein said second means comprises:

means for calculating, at a time and in parallel, the distances between b input signals of said input vector and b components of any one of said n output vectors such that subtraction between one of said b input signals and corresponding one of said b components is performed, and for obtaining the distances between said input vector and said n output vectors so as to sequentially output signals indicating such distances; and means responsive to said signals indicating such distances and operative to compare these distances to determine the shortest of such distances so as to output a signal indicating the shortest distance and an index signal associated with one of said n output vectors which is positioned at the shortest distance from said input vector.

4. Coder as claimed in claim 1, wherein said plurality of basic cell means are connected in parallel in a necessary number of stages, the outputs of the respective basic cell means being compared to produce vector quantization coded signals.

5. Coder as claimed in claim 1, wherein said plurality of basic cell means are connected in series in a necessary number of stages, the output of the respective basic cell means being taken in as an initial distortion and its index by the basic cell means in the next stage, coded output being obtained from the basic cell means in the last stage.

* * * * *